(12) United States Patent  (10) Patent No.: US 7,639,626 B2
Singh et al.  (45) Date of Patent: Dec. 29, 2009

(54) BUILT IN SELF TEST

(75) Inventors: Bhajan Singh, Birmingham (GB); Vipul Raithatha, Northampton (GB); Tom Leslie, Northampton (GB)

(73) Assignee: Texas Instruments Incorporated, Dallas, TX (US)

( * ) Notice: Subject to any disclaimer, the term of this patent is extended or adjusted under 35 U.S.C. 154(b) by 564 days.

(21) Appl. No.: 11/151,070

(22) Filed: Jun. 13, 2005

(65) Prior Publication Data

US 2005/0286433 A1   Dec. 29, 2005

(30) Foreign Application Priority Data

Jun. 12, 2004   (GB) ................. 0413147.0

(51) Int. Cl.
 *G01R 31/08*   (2006.01)
(52) U.S. Cl. ..................................... 370/249
(58) Field of Classification Search ............... 370/241, 370/243, 245, 249, 252, 254
 See application file for complete search history.

(56) References Cited

U.S. PATENT DOCUMENTS

| | | | | |
|---|---|---|---|---|
| 5,912,901 A * | 6/1999 | Adams et al. | ............... | 714/733 |
| 6,085,345 A * | 7/2000 | Taylor | ....................... | 714/731 |
| 6,377,082 B1 * | 4/2002 | Loinaz et al. | ................. | 327/20 |
| 6,489,803 B1 * | 12/2002 | Steiner et al. | ................. | 326/31 |
| 6,766,486 B2 * | 7/2004 | Neeb | ........................... | 714/724 |
| 7,254,169 B1 * | 8/2007 | Steiner et al. | ............... | 375/227 |
| 7,269,772 B1 * | 9/2007 | Li et al. | ...................... | 714/733 |
| 2003/0046624 A1 | 3/2003 | Muhtaroglu | | |

\* cited by examiner

*Primary Examiner*—Derrick W Ferris
*Assistant Examiner*—Mohammad Anwar
(74) *Attorney, Agent, or Firm*—William B. Kempler; Wade J. Brady, III; Frederick J. Telecky, Jr.

(57) ABSTRACT

There is provided a method for Loss of Signal Built In Self Test, and corresponding apparatus comprising: a loopback driver for receiving test signals, and for directing the test signals to at least one of a first output of the loopback driver and a second output of the loopback driver; a Digital to Analogue Converter DAC connected to the loopback driver for controlling the amplitude of the data input signals transmitted by the loopback driver; and coupling means for directing the scaled signals to a Loss of Signal detector. Also provided is a method for testing the hysteresis thresholds of an ACJTAG module, and corresponding apparatus comprising a loopback driver for receiving data test signals, and for directing the test signals to at least one of a first output of the loopback driver and a second output of the loopback driver; a Digital to Analogue Converter DAC connected to the loopback driver for controlling the amplitude of the data input signals transmitted by the loopback driver; and coupling means for directing the scaled signals to the ACJTAG block.

4 Claims, 2 Drawing Sheets

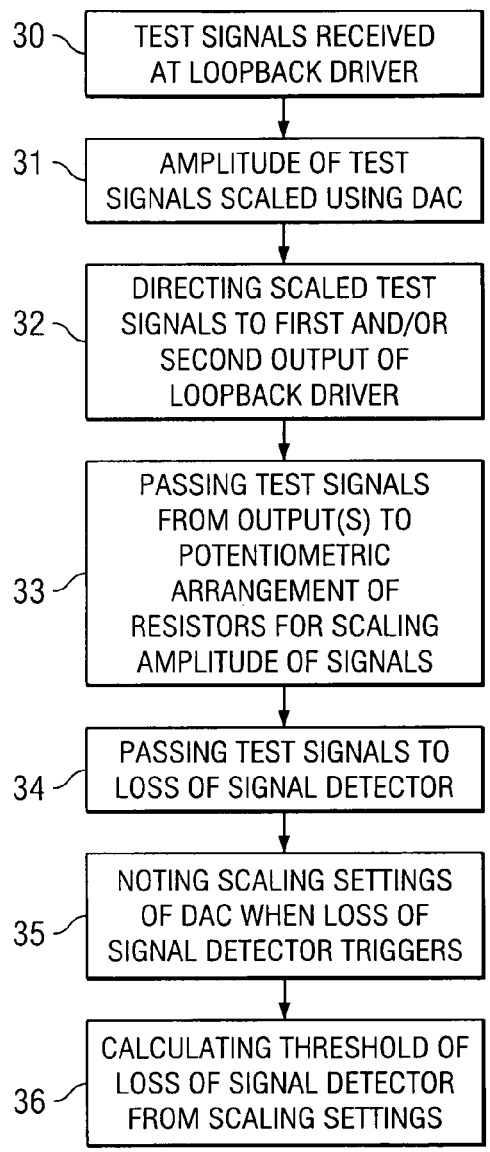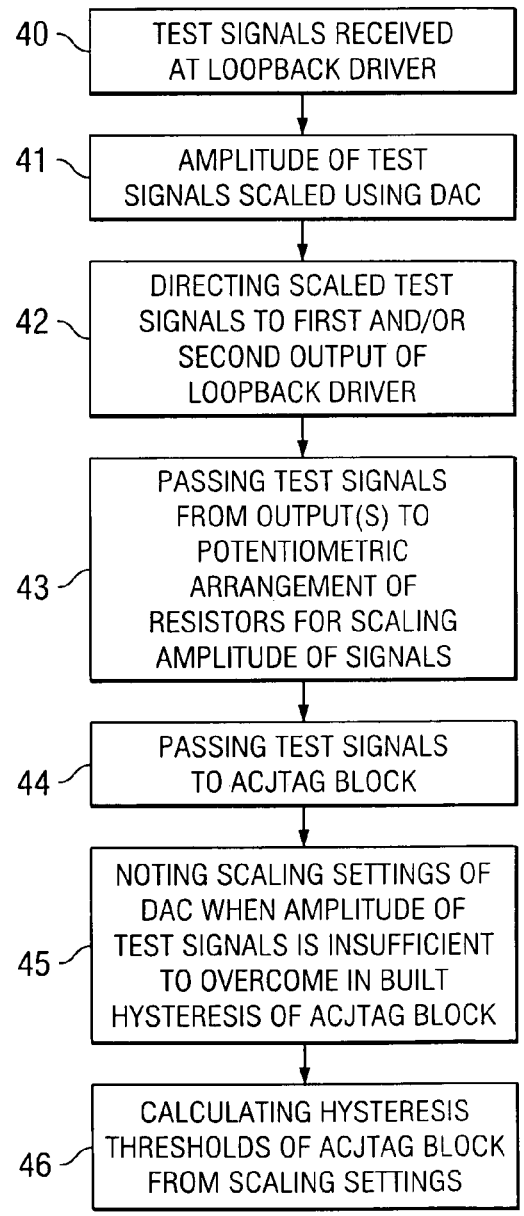

BUILT IN SELF TEST

FIELD OF THE INVENTION

The present invention relates to electronic testing, and more particularly, to circuitry and methods for testing Loss of Signal detectors and IEEE 1149.6 specification (ACJTAG) blocks.

BACKGROUND OF THE INVENTION

Testability is predicted to become a primary design specification and has to be addressed in the early design stages, as escalating test time & costs need to be controlled and quality levels improved. In addition to improved manufacturing tests, Built In Self Test (BIST) offers an extension towards in-field verification while also allowing test re-use and providing a promising approach to automate mixed signal test generation.

Loss of signal detectors are used to monitor a lack of a signal, i.e. when the amplitude of the signal falls below a threshold value and can no longer be detected. Conventional techniques to test a Loss of Signal detector, involve applying test signals below the supposed threshold value at the relevant bond pads of the chip containing the detector circuit. However, using the bond pads to apply the necessary test signals to the Loss of Signal detector is an involved process because it is not easy to inject the required high frequency variable amplitude signals at the bond pads.

There is a need for a simple test method and apparatus for measuring the threshold at which a signal can no longer be detected for a Loss of Signal detector that avoids the drawbacks associated with using bond pads.

There is also a need for a loss of signal test apparatus that can be incorporated onto the chip of the device that it would be used to test, with minimal overhead.

Conventional techniques for determining the hysteresis thresholds of an ACJTAG block involve applying a variable amplitude signal to the relevant bond pads of the chip. Thus there is a need for a non-external test method for determining the hysteresis thresholds of an ACJTAG block.

SUMMARY OF THE INVENTION

The present invention provides a Loss of Signal Built In Self Test apparatus, comprising: a loopback driver for receiving data and clock input signals, and for directing the data or the clock input signals to a first output of the loopback driver and/or a second output of the loopback driver; coupling means for: connecting either or both of the first and the second output of the loopback driver to a potentiometric arrangement of resistors for scaling the amplitude of the signals travelling therethrough, and directing the scaled signals to at least one of a Loss of Signal detector and a main data path.

According to another aspect of the invention there is provided Test apparatus for testing the in built hysteresis of an ACJTAG block, comprising: a loopback driver for receiving data test signals, and for directing the test signals to at least one of a first output of the loopback driver and a second output of the loopback driver; a Digital to Analogue Converter DAC connected to the loopback driver for controlling the amplitude of the data input signals transmitted by the loopback driver; and coupling means for directing the scaled signals to the ACJTAG block.

Specific embodiments of the invention will now be described, by way of example only, with reference to the accompanying drawings, in which:

BRIEF DESCRIPTION OF THE DRAWINGS

FIG. 3 is a flow diagram showing a BIST method according to a preferred embodiment of the present invention.

FIG. 4 is a flow diagram which shows the steps in testing the hysteresis thresholds of the ACJTAG block.

DETAILED DESCRIPTION OF SPECIFIC EMBODIMENTS OF THE INVENTION

Figure 1:
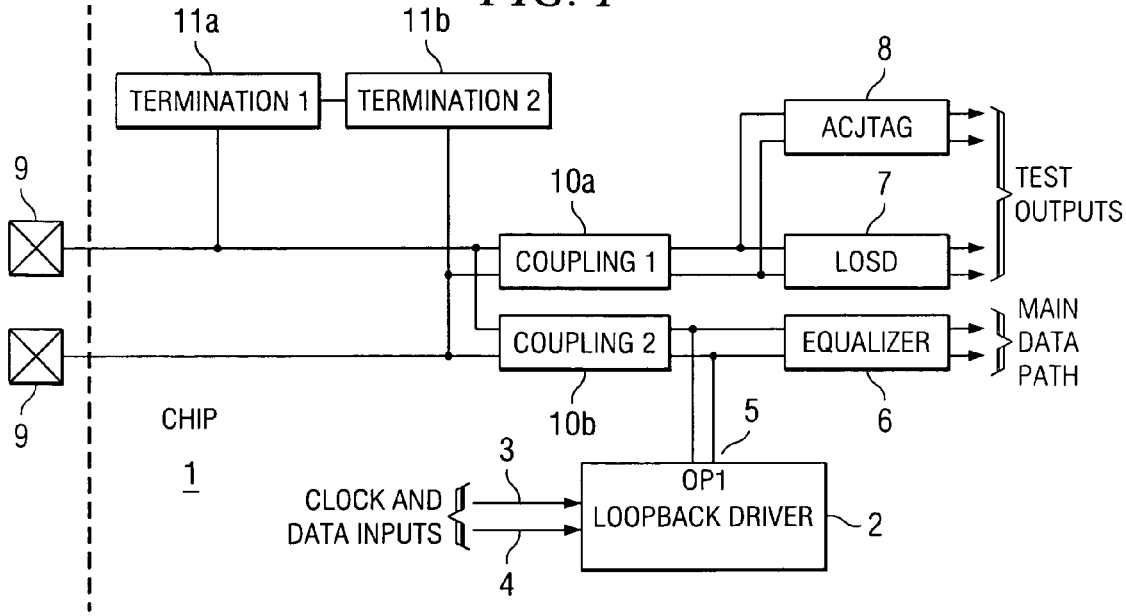
FIG. 1 is a schematic diagram showing a front end of a data receiver.

FIG. 1 shows a portion of a chip 1 comprising a loopback driver 2, part of the circuitry of the front end of a data receiver comprising an equalizer 6, a Loss of Signal detector 7, and an ACJTAG block 8. The chip 1 also has bond pads 9 to which voltage signals are applied during normal use. The loopback driver 2 has two inputs 3, 4 for receiving data and clock signals from a Pseudorandom Binary Source (PRBS) generator (not shown), and an output 5 for passing the data and clock signals to the main data path and to test paths via resistive couplings 10*a*, 10*b*. The purpose of the loopback driver 2 is to insert data (ones and zeros) into the main signal path for testing various circuits in the data receiver, such as eyescan circuits.

Conventional techniques to test the Loss of Signal detector 7, involve applying test signals at the bond pads 9 of the chip 1.

The present invention makes use of this existing circuitry plus a few additional components for testing the Loss of Signal detector 7 using a Built In Self Test technique, as well as for testing the hysteresis thresholds of the ACJTAG block 8.

Figure 2:
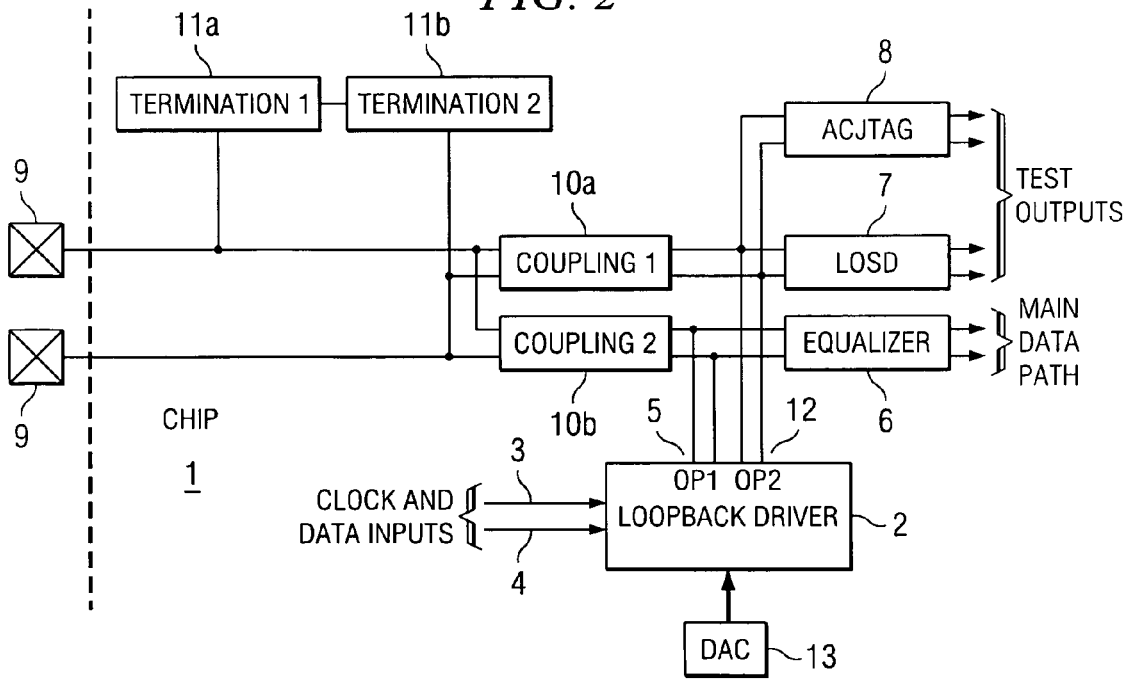
FIG. 2 is a schematic diagram showing a front end of a data receiver including BIST circuitry for a Loss of Signal detector and for an ACJTAG module according to a preferred embodiment of the present invention.

With reference to FIG. 2, the portion of the chip that is shown is similar to the chip shown previously in FIG. 1, except the function of the loopback driver 7 has been enhanced by the addition of a second output 12, a pair of switches (not shown in FIG. 2) for selecting the first output and/or the second output, and a Digital to Analogue Converter (DAC) 13 for amplitude control. This enables variable amplitude high speed data to be injected either:

i) into the main signal path (useful for testing modules or cells), or ii) into the test path, where it may be used to test ancillary functions such as the loss of signal detector 7, or ACJTAG 8, or iii) both.

The second output OP2 allows data test signals from the loopback driver to be passed to the test paths leading to the Loss of signal detector 7 and the ACJTAG block 8. According to a preferred embodiment, since the first output OP1 and the second output OP2 can be separately enabled, it is possible to select the first output OP1 from where the data signal travels via Coupling2 to the termination resistors 11*a*, 11*b* and then via Coupling1 to the ancillary test functions. It is also possible to select the second output OP2 from where the signal travels via Coupling1 to the termination resistors 11*a*, 11*b* and then via Coupling2 to the main data path. Used in this way the potentiometric division of the couplings 10*a*, 10*b* and termination resistors 11*a*, 11*b* give a further useful scaling of the data amplitude, in addition to the DAC 13. Advantageously, this allows a DAC with a smaller scaling range to be used instead of one having a larger range, and the data test signals to be scaled down enough for conducting comprehensive testing.

In another embodiment data signals are passed directly from the loopback driver 2 to the test paths and/or the main signal path, without being scaled by the potentiometric arrangement of the resistive couplings 10a, 10b and termination resistors 11a, 11b. However, in order to achieve the necessary scaling of the amplitude of the data signals required for testing purposes, a DAC 13 having a large scaling amplitude range is used.

A preferred arrangement allows the magnitude of the high speed data to be scaled which enables measurement of the threshold at which a signal can no longer be detected by the Loss of Signal detector 7. This is because the values of the couplings 10a, 10b and termination resistors 11a, 11b are known, as are the DAC 13 settings used when the Loss of Signal detector 7 is triggered during the BIST procedure.

FIG. 3 shows the steps employed in the Built In Self Test for the Loss of Signal detector. Clock or Data test signals typically of the order of 4.2 Gbit/s are received by the loopback driver 30. The signals are scaled by the DAC 31 connected to the loopback driver and are directed to either or both of the outputs of the loopback driver 32. The signals are passed from the first output 5 and or the second output 12 of the loopback driver to a potentiometric arrangement of resistors for scaling the amplitude of the signals 33. The signals then pass along the test path to the Loss of Signal detector 34. The Loss of Signal detector is triggered when the received scaled test signals are of a value below its threshold level. When this happens, the scaling settings from the DAC and the values of the potentiometric resistor arrangement 35 are used to calculate the Loss of Signal detector threshold using well-known techniques 36.

In another embodiment, if a large scaling range DAC is used, then the step of passing the test signals through the potentiometric arrangement of resistors may be omitted.

The arrangement shown in FIG. 2 can also provide a means of testing the hysteresis thresholds of the ACJTAG block 8. A requirement of the IEEE 1149.6 specification (colloquially referred to as ACJTAG) is for a comparator capable of verifying the integrity of external interconnect. To facilitate certain aspects of this testing, as well as providing reasonable noise immunity, the 1149.6 specification requires the comparator to have in-built hysteresis. Prior to the present invention, the only method of verifying the level of hysteresis achieved by the comparator is to insert various amplitude signals via the bondpads. The DAC 13, loopback driver 7, and potentiometric dividers 10a, 10b, 11a, 11b of the preferred embodiment as shown in FIG. 2 enable a variable amplitude pattern to appear at the input to the loss-of-signal detector 7. The same variable amplitude pattern will appear at the input to the ACJTAG cell 8. The amplitude can therefore be adjusted until it is insufficient to overcome the in-built hysteresis of the ACJTAG cell 8, which is thus a measure of that hysteresis.

As a practical matter, the data rates required for testing the loss-of-signal detector 7 and the ACJTAG cell 8 are substantially different. Ideally the former will be up to the maximum rate of operation of the design (presently 4.2 GBPS), whereas the ACJTAG cell 8 is only intended for operation up to about 100 MHz. However this latter signal can be generated from a high speed data generator by having it produce long sequences of identical values, i.e. lots of zeros followed by lots of ones or vice versa.

FIG. 4 shows the steps employed in testing the hysteresis thresholds of the ACJTAG block 8. The first four steps 40, 41, 42, 43 are similar to those for the Loss of Signal BIST method shown in FIG. 3 discussed above. After the data test signals have been scaled by the potentiometric arrangement of resistors 43, the test signals are passed to the ACJTAG block 44. When the amplitude of the test signal is insufficient to overcome the in built hysteresis, the scaling settings from the DAC and the values of the potentiometric resistor arrangement 45 are used to calculate the hysteresis thresholds using well-known techniques 46.

By making use of the loopback driver originally intended for testing the main data path, the present invention enables circuitry used for BIST of the Loss of Signal detector and for testing the hysteresis levels of the ACJTAG block to be included onto the chip with minimal overhead.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. Built-in self-test apparatus for testing the in built hysteresis of an ACJTAG block of an integrated circuit, comprising:
   a loopback driver on the integrated circuit for receiving data test signals, and for directing the test signals to at least one of a first output of the loopback driver and a second output of the loopback driver;
   a digital to analog converter (DAC) on the integrated circuit connected to the loopback driver for controlling the amplitude of the data input signals transmitted by the loopback driver; and
   coupling means on the integrated circuit for directing the scaled signals to an input of the ACJTAG block on the integrated circuit.

2. Test apparatus as claimed in claim 1, comprising coupling means for connecting either or both of the first and the second output of the loopback driver to a potentiometric arrangement of resistors for further scaling the amplitude of the signals travelling therethrough.

3. A method for self- testing the hysteresis thresholds of an ACJTAG module on an integrated circuit, comprising the steps:
   generating a high speed test signal including long sequences of identical values;
   receiving said test signal at a loopback driver on the integrated circuit;
   scaling the amplitude of the test signal using a digital to analog converter (DAC) on the integrated circuit;
   directing the scaled test signal to a first output or a second output of the loopback driver;
   passing the test signal output from either of the outputs of the loopback driver to the ACJTAG module on the integrated circuit;
   when the amplitude of the test signal is insufficient to overcome the built in hysteresis, noting scale settings of the Digital to Analog Converter; and
   calculating the hysteresis thresholds of the ACJTAG block from the noted scaling settings.

4. A method as claimed in claim 3 wherein before the step of passing the test signal to the ACJTAG module, said method further comprises the step of:
   passing the test signal output from either of the outputs of the loopback driver to a potentiometric arrangement of resistors which further scales the amplitude of the test signal traveling there through;
   wherein the step of calculating the hysteresis thresholds of the ACJTAG block also involves using the values of the potentiometric arrangement of resistors.

* * * * *

UNITED STATES PATENT AND TRADEMARK OFFICE
CERTIFICATE OF CORRECTION

PATENT NO. : 7,639,626 B2 Page 1 of 1
APPLICATION NO. : 11/151070
DATED : December 29, 2009
INVENTOR(S) : Singh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1128 days.

Signed and Sealed this

Twenty-first Day of December, 2010

David J. Kappos
*Director of the United States Patent and Trademark Office*